(12) United States Patent
Fu et al.

(10) Patent No.: US 9,567,491 B2
(45) Date of Patent: *Feb. 14, 2017

(54) TUNGSTEN CHEMICAL-MECHANICAL POLISHING COMPOSITION

(71) Applicant: Cabot Microelectronics Corporation, Aurora, IL (US)

(72) Inventors: Lin Fu, Naperville, IL (US); Steven Grumbine, Aurora, IL (US); Jeffrey Dysard, St. Charles, IL (US); Tina Li, Warrenville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/750,204

(22) Filed: Jun. 25, 2015

(65) Prior Publication Data

US 2015/0376462 A1 Dec. 31, 2015

Related U.S. Application Data

(60) Provisional application No. 62/017,002, filed on Jun. 25, 2014, provisional application No. 62/017,100, filed on Jun. 25, 2014.

(51) Int. Cl.
| | | |
|---|---|---|
| *C09G 1/02* | (2006.01) | |
| *H01L 21/3105* | (2006.01) | |
| *H01L 21/306* | (2006.01) | |
| *H01L 21/321* | (2006.01) | |
| *C09K 3/14* | (2006.01) | |
| *C09K 13/00* | (2006.01) | |

(52) U.S. Cl.
CPC . *C09G 1/02* (2013.01); *C09K 3/14* (2013.01); *H01L 21/30625* (2013.01); *H01L 21/31053* (2013.01); *H01L 21/31055* (2013.01); *H01L 21/3212* (2013.01); *C09K 3/1463* (2013.01); *C09K 13/00* (2013.01)

(58) Field of Classification Search
CPC ............ C09G 1/02; H01L 21/30625; H01L 21/31053; H01L 21/31055; H01L 21/3212; C09K 3/14; C09K 3/1463; C09K 13/00
See application file for complete search history.

(56) References Cited

U.S. PATENT DOCUMENTS

| | | | |
|---|---|---|---|
| 5,230,833 A | 7/1993 | Romberger et al. | |
| 5,958,288 A * | 9/1999 | Mueller | C09G 1/02 216/53 |
| 5,980,775 A | 11/1999 | Grumbine et al. | |
| 6,117,783 A | 9/2000 | Small et al. | |
| 6,776,810 B1 | 8/2004 | Cherian et al. | |
| 7,029,508 B2 | 4/2006 | Scott et al. | |
| 7,077,880 B2 | 7/2006 | Siddiqui | |
| 7,994,057 B2 | 8/2011 | Dysard et al. | |
| 8,252,687 B2 | 8/2012 | Li et al. | |
| 8,372,999 B2 | 2/2013 | Holland et al. | |
| 8,529,787 B2 | 9/2013 | Higuchi et al. | |
| 8,840,798 B2 | 9/2014 | Han et al. | |
| 2003/0209522 A1 | 11/2003 | Grumbine et al. | |
| 2005/0079718 A1 | 4/2005 | Siddiqui et al. | |
| 2007/0282122 A1 | 12/2007 | Holland et al. | |
| 2008/0038996 A1* | 2/2008 | Maejima | C09G 1/02 451/37 |
| 2009/0081871 A1 | 3/2009 | Dysard et al. | |
| 2009/0081927 A1 | 3/2009 | Grumbine et al. | |
| 2009/0223136 A1* | 9/2009 | Nakajo | C09G 1/02 51/308 |
| 2010/0146864 A1* | 6/2010 | Nakayama | C01B 33/1435 51/298 |
| 2011/0163262 A1 | 7/2011 | Higuchi et al. | |
| 2013/0280910 A1* | 10/2013 | Ihnfeldt | C09K 3/1454 438/693 |

FOREIGN PATENT DOCUMENTS

| | | |
|---|---|---|
| JP | 2011-216582 A | 10/2011 |
| JP | 2013-227182 A | 11/2013 |
| KR | 10-1243331 B1 | 3/2013 |
| KR | 10-2013-0074492 A | 7/2013 |

OTHER PUBLICATIONS

Korean Intellectual Property Office, International Search Report in International Patent Application No. PCT/US2015/037772 (Aug. 26, 2015).
Korean Intellectual Property Office, International Search Report in International Patent Application No. PCT/US2015/037767 (Aug. 26, 2015).
Korean Intellectual Property Office, International Search Report in International Patent Application No. PCT/US2015/037741 (Aug. 26, 2015).
Korean Intellectual Property Office, International Search Report in International Patent Application No. PCT/US2015/037746 (Aug. 31, 2015).
Korean Intellectual Property Office, International Search Report in International Patent Application No. PCT/US2015/037733 (Sep. 30, 2015).
Korean Intellectual Property Office, International Search Report in International Patent Application No. PCT/US2015/037760 (Sep. 30, 2015).

* cited by examiner

*Primary Examiner* — Anita Alanko
(74) *Attorney, Agent, or Firm* — Thomas Omholt; Erika Wilson

(57) ABSTRACT

A chemical-mechanical polishing composition includes colloidal silica abrasive particles having a chemical compound incorporated therein. The chemical compound may include a nitrogen-containing compound such as an aminosilane or a phosphorus-containing compound. Methods for employing such compositions include applying the composition to a semiconductor substrate to remove at least a portion of a layer.

41 Claims, 1 Drawing Sheet

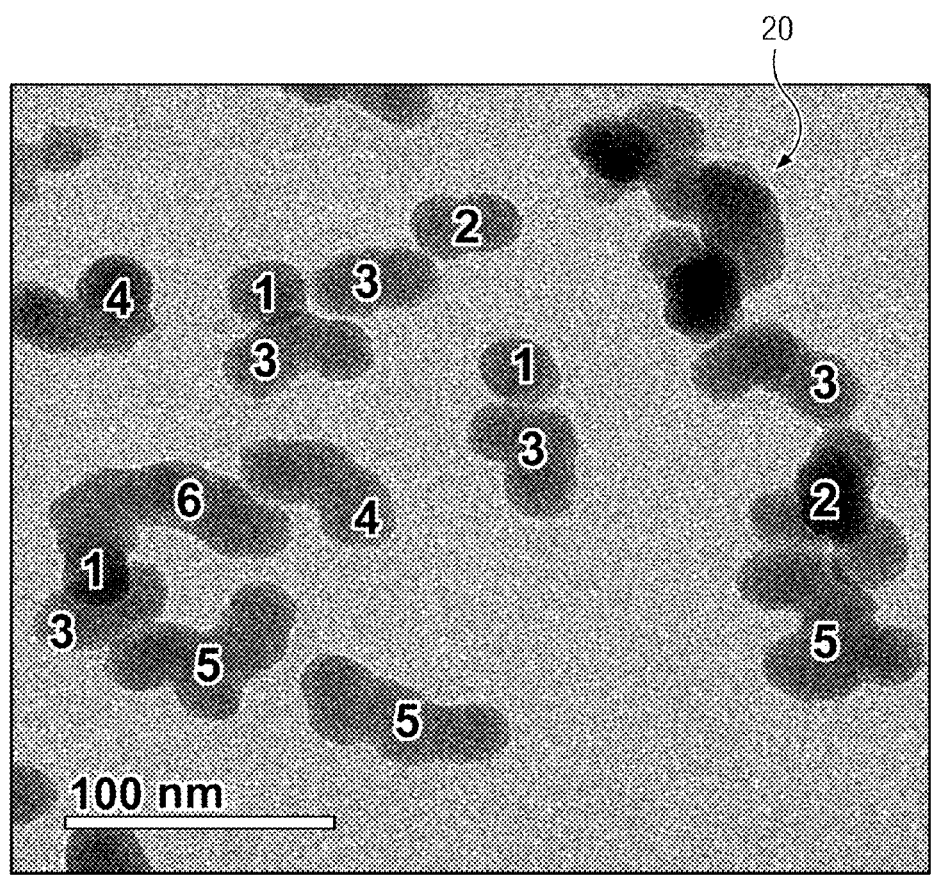

TUNGSTEN CHEMICAL-MECHANICAL POLISHING COMPOSITION

RELATED APPLICATION

This application claims the benefit of U.S. Provisional Application No. 62/017,002 entitled Tungsten Chemical Mechanical Polishing Composition, and U.S. Provisional Application No. 62/017,100 entitled Colloidal Silica Abrasive for a Chemical Mechanical Polishing Composition, each of which was filed Jun. 25, 2014.

BACKGROUND OF THE INVENTION

A number of chemical-mechanical polishing (CMP) operations are used in both front-end-of-the-line (FEOL) and back-end-of-the-line (BEOL) processing of semiconductor devices. For example, the following CMP operations are commonly employed. Shallow trench isolation (STI) is an FEOL process used prior to formation of the transistors. A dielectric such as tetraethyl orthosilicate (TEOS) is deposited in openings formed in the silicon wafer. A CMP process is then used to remove the excess TEOS resulting in a structure in which a predetermined pattern of TEOS is inlaid in the silicon wafer. Tungsten plug and interconnect and copper interconnect and dual damascene processes are BEOL processes used to form the network of metal wires that connect the device transistors. In these processes tungsten or copper metal is deposited in openings formed in a dielectric material (e.g., TEOS). CMP processes are used to remove the excess tungsten or copper from the dielectric to form tungsten or copper plugs and/or interconnects therein. An interlayer dielectric (ILD) material (such as TEOS) is deposited between metal interconnect levels to provide electrical insulation between the levels. An ILD CMP step is commonly employed to smooth and planarize the deposited insulating material prior to building up the subsequent interconnect level.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. A chemical-mechanical polishing composition is generally applied to the surface of the pad while the substrate and pad are moved relative to one another. The relative motion of the substrate and pad (and the applied polishing composition) abrades and removes a portion of the material from the surface of the substrate, thereby polishing the substrate. Polishing of the substrate is generally aided by the chemical activity of the polishing composition (e.g., by a chemical accelerator) and/or the mechanical activity of an abrasive suspended in the polishing composition.

Chemical-mechanical polishing compositions and methods for polishing (or planarizing) the surface of a substrate are well known in the art. Polishing compositions (also known as slurries) for polishing dielectrics commonly include silica or ceria abrasives. Those utilizing silica abrasives commonly have a high pH and a high silica concentration (e.g., greater than 12 weight percent). Polishing compositions for polishing metal layers (such as tungsten or copper) commonly include silica or alumina abrasives as well as various chemical accelerators, such as oxidizers, chelating agents, catalysts, and the like.

As is well known in the art, the semiconductor industry is subject to continuing and severe downward pricing pressure. In order to maintain economically favorable CMP processes, high throughput is required thereby necessitating high removal rates of the primary material being polished (e.g., an ILD CMP process may require a high removal rate of TEOS while a tungsten CMP process may require a high removal rate of tungsten). The downward pricing pressure also extends to the CMP consumables themselves (e.g., to the CMP slurries and pads). Such pricing pressure poses a challenge to the slurry formulator as the pressure to reduce costs often conflicts with the desired slurry performance metrics. There is a real need in the industry for CMP slurries that provide high throughput at reduced overall costs.

BRIEF SUMMARY OF THE INVENTION

A chemical-mechanical polishing composition is disclosed for polishing a substrate including a tungsten layer (such as a semiconductor wafer). The polishing composition includes a water based liquid carrier, colloidal silica abrasive particles dispersed in the liquid carrier, and a chemical species incorporated in the colloidal silica abrasive particles internal to an outer surface thereof. The chemical species is a nitrogen-containing compound or a phosphorus-containing compound, for example including an aminosilane or a phosphonium silane compound. The polishing composition further includes an iron containing accelerator.

BRIEF DESCRIPTION OF THE FIGURE

For a more complete understanding of the disclosed subject matter, and advantages thereof, reference is now made to the following descriptions taken in conjunction with the accompanying FIGURE which depicts a transmission electron micrograph (TEM) of example colloidal silica particles having a distribution of aggregates.

DETAILED DESCRIPTION OF THE INVENTION

A chemical-mechanical polishing composition is disclosed. The composition includes a water based liquid carrier, colloidal silica abrasive particles dispersed in the liquid carrier, and an iron containing accelerator. A nitrogen or phosphorus-containing chemical species such as an aminosilane compound is incorporated in the colloidal silica abrasive particles such that the particles preferably have a permanent positive charge in an acidic pH range. As is described in more detail below, the colloidal silica abrasive particles may be grown in a liquid solution containing the chemical species (e.g., the aminosilane compound) such that the chemical species becomes incorporated into the colloidal silica particles during growth thereof.

Methods for the chemical-mechanical polishing of a substrate using the above described polishing composition is further disclosed. For example, a method for polishing a substrate including a tungsten layer may include contacting the substrate with the above described polishing composition, moving the polishing composition relative to the substrate, and abrading the substrate to remove a portion of the tungsten layer from the substrate and thereby polish the substrate.

The disclosed polishing composition contains a dispersion of abrasive colloidal silica particles suspended in a liquid carrier (e.g., water). As used herein the term colloidal silica particles refers to silica particles that are prepared via a wet process rather than a pyrogenic or flame hydrolysis process which produces structurally different particles. A suitable dispersion may include both aggregated and non-aggregated colloidal silica particles. As is known to those of ordinary skill in the art, non-aggregated particles are individually discrete particles that may be spherical or nearly spherical in shape, but can have other shapes as well. These non-aggregated particles are referred to as primary particles. Aggregated particles are particles in which multiple discrete particles (primary particles) have clustered or bonded together to form aggregates having generally irregular shapes. Aggregated particles may include two, three, or more connected primary particles.

As described above the colloidal silica abrasive particles include a chemical species incorporated into the particles (i.e., in the interior of the particles). The chemical species is a nitrogen-containing compound or a phosphorus-containing compound. When the chemical species is a nitrogen-containing compound it preferably includes an amine containing compound or an ammonium containing compound. When the chemical species is a phosphorus-containing compound it preferably includes a phosphine containing compound or phosphonium containing compound. An ammonium compound may include $R^1R^2R^3R^4N^+$ and a phosphonium compound may include $R^1R^2R^3R^4P^+$, where $R^1$, $R^2$, $R^3$, and $R^4$ represent independently hydrogen, $C_1$-$C_6$ alkyl, a $C_7$-$C_{12}$ arylalkyl, or a $C_6$-$C_{10}$ aryl. These groups can, of course, be further substituted with one or more hydroxyl groups.

Example ammonium compounds may include tetramethylammonium, tetraethylammonium, tetrapropylammonium, tetrabutylammonium, tetrapentylammonium, ethyltrimethylammonium, and diethyldimethylammonium. In certain embodiments, the ammonium compound is preferably not ammonia or ammonium ($NH_3$ or $NH_4^+$).

Example phosphonium compounds may include tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium. Example phosphonium compounds may also include a phosphonium silane compound.

A nitrogen-containing compound may also include a substance having an amino group such as a primary amine, a secondary amine, a tertiary amine, or a quaternary amine compound. Such a nitrogen-containing compound may include an amino acid, for example, an amino acid having from one to eight carbon atoms such as lycine, glutamine, glycine, iminodiacetic acid, alanine, valine, leucine, isoleucine, serine, and threonine.

In certain embodiments, the chemical species may include a nitrogen-containing alkali catalyst, preferably having from 1 to 6 carbon atoms. Suitable compounds may include, for example, ethylenediamine, tetramethylammonium hydroxide (TMAH), or ethyloxypropylamine (EOPA).

In various embodiments, a molar ratio of the chemical species to silica in the colloidal silica abrasive particles is preferably greater than about 0.1 percent (e.g., greater than about 0.2 percent or greater than about 0.3 percent) and less than about 10 percent (e.g., less than 5 percent or less than 2 percent) or in a range from about 0.1 percent to about 10 percent (e.g., from about 0.2 percent to about 5 percent, from about 0.2 percent to about 2 percent, or from about 0.3 percent to about 2 percent). The nitrogen level of the colloidal silica abrasive particles may also be greater than about 0.15 mmol/g $SiO_2$ (e.g., greater than 0.2 mmol/g $SiO_2$).

Aminosilane compounds are the most preferred nitrogen-containing compound. Such aminosilane compounds may include primary aminosilanes, secondary aminosilanes, tertiary aminosilanes, quaternary aminosilanes, and multi-podal (e.g., dipodal) aminosilanes. The aminosilane compound may include substantially any suitable aminosilane, for example, a propyl group containing aminosilane, or an aminosilane compound including a propyl amine. Examples of suitable aminosilanes may include bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, (N-trialkoxysilylpropyl) polyethyleneimine, trialkoxysilylpropyldiethylenetriamine, N-phenyl-3-aminopropyltrialkoxysilane, N-(vinylbenzyl)-2-aminoethyl-3-aminopropyltrialkoxysilane, 4-aminobutyltrialkoxysilane, and mixtures thereof. Those of ordinary skill in the art will readily appreciate that aminosilane compounds are commonly hydrolyzed (or partially hydrolyzed) in an aqueous medium. Thus by reciting an aminosilane compound, it will be understood that the aminosilane and/or a hydrolyzed (or partially hydrolyzed) species and/or condensed species thereof may be incorporated in the colloidal silica abrasive particles.

In embodiments in which the nitrogen-containing compound is an aminosilane compound, a molar ratio of the aminosilane compound to silica in the colloidal silica abrasive particles is preferably less than about 10% (e.g., less than about 8%, less than about 6%, less than about 5%, less than about 4%, or less than about 2%). The molar ratio is also preferably (although not necessarily) greater than about 0.1% (e.g., greater than about 0.2% or greater than about 0.3%). It will be understood that the molar ratio of the aminosilane compound to silica in the colloidal silica abrasive particles may be approximately equal to the molar ratio of the aminosilane compound to the silica producing compound in the liquid solution in which the colloidal silica abrasive particles are grown.

It will be understood that the colloidal silica abrasive particles may include two or more of the above described chemical species incorporated in the particles. For example, in one colloidal silica embodiment, a first incorporated chemical species may include an aminosilane compound and a second incorporated chemical species may include an ammonium compound, such as a quaternary amine. In an embodiment in which the first chemical species is ammonium and the second chemical species is a quaternary amine, a molar ratio of the first chemical species to the second chemical species is preferably less than about 5 to 1.

CMP compositions including positively charged colloidal silica abrasive particles have been disclosed, for example, in U.S. Pat. Nos. 7,994,057 and 8,252,687. In these patents, the positive charge on the silica particles was achieved via treating an external surface of the particles with a positively charged chemical compound such as a quaternary amine containing compound or an aminosilane containing compound. While certain benefits may be achieved when utilizing CMP compositions including such positively charged silica abrasive particles, the use of a surface treating agent may mask (or shield) the particle surface (e.g., the silanol and/or siloxane groups on the surface) such that the abrasive may not always have some of the same desirable properties as an untreated silica abrasive. For example, surface treatment may adversely affect the shelf life of the composition and the ability to concentrate the composition. Moreover, the use of surface treatment compounds may pose a challenge for post-CMP wafer cleaning operations.

One aspect of the invention is the realization that positively charged colloidal silica abrasive particles may alternatively be obtained via incorporating certain positively charged chemical species into the abrasive particles (i.e., incorporating the chemical species sub-surface in the interior of the particles). Colloidal silica abrasive particles having an internal chemical species that provides a positive charge may be fabricated, for example, via growing the abrasive particles in a liquid solution containing the chemical species such that the chemical species become incorporated into at least a portion of the colloidal silica particles during growth thereof. Such abrasive particles may alternatively be fabricated via treating a conventional colloidal silica particle with the chemical species and then growing additional silica over the chemical species (and thereby covering the chemical species with additional silica). While the chemical species is incorporated internally in the colloidal silica abrasive particles, it will be understood that a portion of the chemical species may be at or near the particle surface (such that the chemical species is both internal to the surface and at the surface).

In a first embodiment, colloidal silica abrasive particles having an internal chemical species may be fabricated, for example, via (i) providing a liquid solution (e.g., including water at a predetermined pH) and (ii) combining the liquid solution with the silica producing compound and the chemical species thereby causing colloidal silica particles to grow in the liquid solution such that a dispersion is obtained including colloidal silica particles having the chemical species incorporated therein. The chemical species may alternatively be included in the liquid solution provided in (i). The silica producing compound may include, for example, tetramethyl orthosilicate (TMOS), tetraethyl orthosilicate (TEOS), silicic acid, an alkali or ammonium silicate, or a silicon tetrahalide. This methodology is similar to that disclosed in U.S. Pat. No. 8,529,787 in which TMOS is continuously added to a mother liquid including an alkali catalyst (the similarity is that a silica producing compound is combined with a liquid solution to produce colloidal silica particles).

The method may further include processing the dispersion to obtain a chemical-mechanical polishing composition including the colloidal silica particles with the chemical species incorporated therein. The processing may include, for example, diluting the dispersion with water and/or distilling the dispersion to remove methanol or ethanol bi-products obtained during growth of the colloidal silica particles. The processing may alternatively and/or additionally include adjusting the pH to a desired value and/or adding other chemical components such as an oxidizer, an accelerator, a catalyst, a buffer, a chelating agent, a corrosion inhibitor, a film forming agent, a surfactant, a polishing uniformity additive, a biocide, and the like. The processing does not include a high temperature calcination step that would burn off (or otherwise remove) the chemical species from the colloidal silica particles, as it is desirable for the chemical species to remain in the colloidal silica particles.

The chemical species dissolved in the aqueous liquid solution may include any one or more of the species described above, but most preferably includes an aminosilane compound. The chemical species may be added to the liquid solution in substantially any suitable amount such that a sufficient amount is incorporated into the colloidal silica particles (with the particles preferably—although not necessarily—including less than 10 weight percent of the chemical species incorporated therein). The aqueous liquid solution may further optionally include an alkali catalyst, for example, including an ether amine, an ethylene amine, a tetraalkyl amine, and/or an alcohol amine. Suitable alkali catalysts may include an organic base catalyst such as ethylenediamine, diethylenetriamine, triethylenetetramine, ammonia, urea, monoethanolamine, diethanolamine, triethanolamine, tetramethylammonium hydroxide (TMAH), tetramethylguanidine, tetraethylammonium hydroxide, aminopropylmorpholine, hexyloxypropylamine, ethyloxypropylamine (EOPA), jeffamine HK-511, or combinations thereof. In certain embodiments, the alkali catalyst may preferably have from 1 to 6 carbon atoms. The alkali catalyst may alternatively and/or additionally include potassium hydroxide (KOH). The amount of alkali catalyst added may be selected so that the pH of the aqueous liquid solution is generally in the range from about 7 to about 14 and preferably in the range from about 9 to about 12.

The liquid solution may optionally further include colloidal silica particles that are intended to act as nucleation sites for growth of the colloidal silica. In such embodiments, the final colloidal silica may be thought of as having a core-shell structure (or a multi-layer structure) in which the core (the inner layer) includes the colloidal silica particles originally added to the liquid solution and the shell (the outer layer) includes the silica that is grown over the core and includes an internal chemical species (such as an aminosilane). In particles having a core-shell structure, the shell may have substantially any suitable thickness, for example, greater than 1 nm (e.g., greater than 2 nm, greater than 3 nm, or greater than 5 nm). It will be understood that the disclosed embodiments are not limited colloidal silica particles having a core-shell structure as the internal chemical species (e.g., the aminosilane) may be distributed throughout substantially the entire particle.

In a second embodiment, colloidal silica abrasive particles having an internal chemical species may be fabricated, for example, via (i) providing a high pH silicate solution (e.g., a sodium silicate or potassium silicate solution), (ii) processing the silicate solution to protonate the silicate anions and form silicic acid (e.g., via adding an acid to the solution or passing the solution through an ion exchange column) which in turn causes precipitation and growth of colloidal silica particles in a reaction vessel, and (iii) adding the chemical species to the reaction vessel such that it becomes incorporated into the growing colloidal silica particles. The silicate solution preferably has a pH in the range from about 11 to about 13. The silicate solution may be passed through an ion exchange column into the reaction vessel which tends to lower the pH to a value in a range from about 2 to about 5. The chemical species may be added to the reaction vessel in substantially any suitable amount (and at substantially any suitable rate) such that a sufficient amount is incorporated into the colloidal silica particles (with the particles preferably—although not necessarily—including less than 10 weight percent of the chemical species incorporated therein).

In a third embodiment, colloidal silica abrasive particles may be fabricated, for example, via treating (e.g., surface treating) a conventional colloidal silica particle with a chemical species and then growing additional silica over the treated colloidal silica (i.e., over the chemical species). For example, a nitrogen-containing compound such as a quaternary amine compound or an aminosilane compound may be added to a colloidal silica containing dispersion (e.g., as taught in U.S. Pat. Nos. 7,994,057 and 8,252,687). After sufficient time to allow the nitrogen compound to become associated (e.g., chemically bonded or electrostatically associated) with the colloidal silica particles, a silica producing compound such as TMOS, TEOS, silicic acid, an alkali or ammonium silicate, or a silica tetrahalide may be added to the dispersion. The dispersion may be optionally heated (e.g., to 45 degrees C.) to accelerate further growth of the colloidal silica particles such that the chemical species (the surface treatment agent) becomes incorporated into the particle. Such colloidal silica particles may be thought of as having at least two layers, a first inner layer including the treated colloidal silica and a second outer layer of silica deposited over the inner layer thereby incorporating the chemical species in the particle.

Positively charged colloidal silica abrasive particles may alternatively be obtained via incorporating a positively charged chemical species into the abrasive particles and then further bonding (via surface treating) the same or a different chemical species to the particle surface. Such abrasive particles may be fabricated, for example, by first growing the colloidal silica particles in a liquid solution containing the chemical species (e.g., using one of the methodologies described above) such that the chemical species becomes incorporated into at least a portion of the colloidal silica particles during growth thereof and then subsequently surface treating the particles. For example, in one embodiment the colloidal silica abrasive particles may include an internal chemical species including a nitrogen-containing alkali catalyst having from 1 to 6 carbon atoms (such as the aforementioned ethylenediamine, TMAH, or EOPA). The abrasive particles may then further be surface treated, for example, with an aminosilane compound. Such colloidal silica abrasive particles may advantageously achieve high charge levels using very low surface treatment levels of the aminosilane (and thereby potentially masking a smaller percentage of the silanol and/or siloxane groups on the surface).

In embodiments in which the colloidal silica abrasive particles include an internal nitrogen-containing alkali catalyst having from 1 to 6 carbon atoms and are further surface treated with an aminosilane compound, the colloidal silica abrasive particles may include a low level of the internal chemical species, for example, less than 0.20 mmol/g of nitrogen. In such embodiments the zeta potential of the particles prior to the surface treatment may be less than 15 mV (e.g., less than 13 mV or less than 10 mV) at a pH of 4. Likewise, the colloidal silica abrasive particles may include a low level of the aminosilane compound bonded to the surface, for example, to less than 4% (e.g., less than 3%, or less than or equal to 2%) of the silanol groups on the surface (assuming 4.5 SiOH per $nm^2$ and the BET surface area of the silica).

It will be understood that the above described methodologies for fabricating colloidal silica particles having an internal chemical species result in a dispersion in which the colloidal silica particles are suspended in a liquid carrier. In fabricating the chemical-mechanical polishing compositions described herein, the dispersion may be diluted to a predetermined concentration of colloidal silica particles. Moreover, other chemical compounds may be added to the dispersion (before or after dilution) as desired. Such chemical compounds may include substantially any of the compounds disclosed herein.

The colloidal silica particle may have substantially any suitable degree of aggregation. For example, the colloidal silica abrasive may be substantially non-aggregated in that it includes mostly primary particles. Alternatively, the colloidal silica abrasive may be partially aggregated. By partially aggregated it may be meant that 50 percent or more of the colloidal silica abrasive particles include two or more aggregated primary particles or that 30 percent or more (or 45 percent or more) of the colloidal silica particles include three or more aggregated primary particles. Such partially aggregated colloidal silica abrasives may be prepared, for example, using a multi-step process in which primary particles are first grown in solution, for example as described in U.S. Pat. No. 5,230,833. The pH of the solution may then be adjusted to an acidic value for a predetermined time period to promote aggregation (or partial aggregation), for example, as described in U.S. Pat. No. 8,529,787. An optional final step may allow for further growth of the aggregates (and any remaining primary particles).

The colloidal silica abrasive particles may further have an aggregate distribution in which 20 percent or more of the colloidal silica abrasive particles include less than three primary particles (i.e., non-aggregated primary particles or aggregated particles having just two primary particles, also referred to as monomers and dimers) and 50 percent or more of the colloidal silica abrasive particles include three or more aggregated primary particles.

The FIGURE depicts a transmission electron micrograph (TEM) of example colloidal silica particles having the above described aggregate distribution for a CMP composition. The example TEM depicts colloidal silica particles having from one to six primary particles. A total of 16 particles were counted, three of which consisted of a single primary particle, two of which consisted of two aggregated primary particles, five of which consisted of three aggregated primary particles, two of which consisted of four aggregated primary particles, three of which consisted of five aggregated primary particles, and one of which consisted of six aggregated primary particles. The depicted image also includes what appears to be a large particle in the upper right (depicted at 20) that was not counted as it was unclear from the image whether this feature was a single aggregate or multiple aggregates lying in close proximity to one another. Given the relatively small number of particles in any one image, it will be understood that in order to obtain a statistically significant measure of the aggregate distribution, it is generally necessary to evaluate a large number of TEM images.

Colloidal silica abrasive particles having an aggregate distribution as described herein may be grown, for example, as described above with respect to U.S. Pat. Nos. 5,230,833 and 8,529,787. Alternatively, colloidal silica abrasive particles having an aggregate distribution (as defined above) may be prepared by adding primary particles to a partially aggregated or aggregated colloidal silica. For example, primary colloidal silica particles may be added to a dispersion having partially aggregated colloidal silica particles in which 50 percent or more of the colloidal silica abrasive particles include three or more aggregated primary particles such that 5 percent or more of the colloidal silica abrasive particles are primary particles. In such an embodiment, the aggregated colloidal silica particles may have a mean particle size in a range from about 40 to about 60 nm while the primary colloidal silica particles may have a mean particle size in a range from about 15 to about 35 nm. Moreover, the polishing composition may include from about 1 to about 4 weight percent of the aggregated colloidal silica particles and from about 0.05 to about 0.5 weight percent of the primary colloidal silica particles that are not aggregated.

The particle size of a particle suspended in a dispersion may be defined in the industry using various means. In the embodiments disclosed herein, the particle size is defined as measured by the Zetasizer® available from Malvern Instruments®. The abrasive particles may have substantially any particle size suitable for the particular CMP operation. The abrasive particles preferably have an average particle size of about 10 nm or more (e.g., about 20 nm or more, about 30 nm or more, or about 40 nm or more). The abrasive particles preferably also have an average particle size of about 100 nm or less (e.g., about 80 nm or less, about 70 nm or less, or about 60 nm or less). Accordingly, the abrasive particles may have an average particle size in a range from about 10 nm to about 100 nm (e.g., from about 20 nm to about 80 nm, or from about 30 to about 70, or from about 40 to about 60).

The colloidal silica abrasive particles may further have substantially any suitable primary particle size. In certain embodiments, the primary particle size may be in a range from about 15 to about 35 nm (e.g., from about 20 to about 30 nm). Moreover, it may be advantageous for the primary particles to all have about the same size (such that the colloidal silica has a narrow primary particle size distribution). For example, greater than 90% (e.g., greater than 95%, greater than 98%, or greater than 99%) of the primary particles may have primary particle size in a range from about 15 to about 35 nm (e.g., from about 20 to about 30 nm). Furthermore, a standard deviation of the primary particle size may be less than about 5 nm.

The polishing composition may include substantially any suitable amount of colloidal silica particles, however, in general the point of use amount is desirably low so as to reduce the cost of the CMP operation. Polishing compositions used for bulk tungsten removal may include about 0.1 wt. % or more of the colloidal silica abrasive particles (e.g., about 0.2 wt. % or more, about 0.3 wt. % or more, or about 0.4 wt % or more). The point of use polishing composition may include about 3 wt. % or less of the colloidal silica abrasive particles (e.g., about 2 wt. % or less, about 1.5 wt. % or less, or about 1 wt. % or less). Preferably, the amount of colloidal silica particles in such polishing compositions used for bulk tungsten removal is in a range from about 0.1 wt. % to about 3 wt. %, and more preferably from about 0.2 wt. % to about 2 wt. % (e.g., from about 0.2 wt. % to about 1 wt. %).

Polishing compositions used for a tungsten buffing operation may include about 0.3 wt. % or more of the colloidal silica abrasive particles (e.g., about 0.5 wt. % or more, about 0.8 wt. % or more, or about 1 wt % or more). The point of use polishing composition may include about 5 wt. % or less of the colloidal silica abrasive particles (e.g., about 4 wt. % or less, about 3.5 wt. % or less, or about 3 wt. % or less). Preferably, the amount of colloidal silica particles in such polishing compositions used for tungsten buffing is in a range from about 0.3 wt. % to about 5 wt. %, and more preferably from about 0.8 wt. % to about 4 wt. % (e.g., from about 1 wt. % to about 4 wt. %).

The polishing composition of the invention may advantageously be provided as a concentrate which is intended to be diluted with an appropriate amount of water prior to use. In such an embodiment, the concentrate may include more than 5 wt. % of the colloidal silica (e.g., more than about 8 wt. %, more than about 10 wt. %, or more than about 12 wt. %). The concentrate may also include less than about 25 wt. % of the colloidal silica (e.g., less than about 22 wt. %, less than about 20 wt. %, or less than about 18 wt. %). The concentrate preferably includes from about 5 to about 25 wt. % of the colloidal silica (e.g., from about 8 to about 22 wt. %, from about 10 to about 20 wt. %, or from about 12 to about 18 wt. %). Depending on the level of other additives in the polishing composition, the concentrate may optionally include from about 5 to about 20 wt. % of the colloidal silica (e.g., from about 8 to about 15 wt. %).

The liquid carrier is used to facilitate the application of the abrasive and any optional chemical additives to the surface of a suitable substrate to be polished (e.g., planarized). The liquid carrier may be any suitable carrier (e.g., solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The colloidal silica abrasive particles may optionally have a permanent positive charge in the polishing composition. The charge on dispersed particles such as colloidal silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using the Model DT-1202 Acoustic and Electroacoustic spectrometer available from Dispersion Technologies, Inc. (Bedford Hills, N.Y.).

The colloidal silica particles in the polishing composition preferably have a permanent positive charge of about 6 mV or more (e.g., about 8 mV or more, about 10 mV or more, about 13 mV or more, about 15 mV or more, or about 20 mV or more). The colloidal silica particles in the polishing composition may have a permanent positive charge of about 50 mV or less (e.g., about 45 mV or less, about 40 mV or less, or about 35 mV or less). Preferably, the colloidal silica particles have a permanent positive charge in a range from about 6 mV to about 50 mV (e.g., about 10 mV to about 45 mV, about 15 mV to about 40 mV, or about 20 mV to about 40 mV).

By permanent positive charge it is meant that the positive charge on the silica particles is not readily reversible, for example, via flushing, dilution, filtration, and the like. A permanent positive charge may be the result of incorporating the positive charged species in the particle. A permanent positive charge may further result from a covalent interaction between the particle and a positively charged species and is in contrast to a reversible positive charge that may be the result, for example, of an electrostatic interaction between the particle and a positively charged species.

Notwithstanding, as used herein, a permanent positive charge of at least 6 mV means that the zeta potential of the colloidal silica particles remains above 6 mV after the following three step filtration test. A volume of the polishing composition (e.g., 200 ml) is filtered through a Millipore Ultracell regenerated cellulose ultrafiltration disk (e.g., having a molecular weight (MW) cutoff of 100,000 Daltons and a pore size of 6.3 nm). The remaining dispersion (the approximately 65 ml of dispersion that is retained by the ultrafiltration disk) is collected and replenished with pH adjusted deionized water. The deionized water is pH adjusted to the original pH of the polishing composition using a suitable inorganic acid such as nitric acid. This procedure is repeated for a total of three filtration cycles. The zeta-potential of the triply filtered and replenished polishing composition is then measured and compared with the zeta potential of the original polishing composition. This three step filtration test is further illustrated below by way of example (Example 7).

While not wishing to be bound by theory, it is believed that the dispersion retained by the ultrafiltration disk (the retained dispersion) includes the silica particles and any chemical components (e.g., the positively charged species) that may be in the particles or associated with the surface of the particles (e.g., bonded, attached, electrostatically interacting, or in contact with the particle surface). At least a portion of the liquid carrier and the chemical components dissolved therein pass through the ultrafiltration disk. Replenishing the retained dispersion to the original volume is believed to upset the equilibrium in the original polishing composition such that the chemical components associated with the particle surface may tend towards a new equilibrium. Components that are in the particle or are strongly associated (e.g., covalently bonded) with the particle surface remain with the particle such that there tends to be little if any change in the positive zeta potential thereof. In contrast, a portion of components that have a weaker association (e.g., an electrostatic interaction) with the particle surface may return to the solution as the system tends towards the new equilibrium thereby resulting in a reduction in the positive zeta potential. Repeating this process for a total of three ultrafiltration and replenishing cycles is believed to amplify the above described effect.

It is preferred that there is little difference between the zeta potential of the colloidal silica particles in the original polishing composition and the colloidal silica particles in the polishing composition after the above described three step filtration test (after correcting for ionic strength differences resulting from the filtration test). For example, it is preferred that the zeta potential of the colloidal silica particles in the original polishing composition is less than about 10 mV greater than the zeta potential of the colloidal silica particles after the three step filtration test (e.g., less than about 7 mV greater, less than about 5 mV greater, or even less than about 2 mV greater). Stated another way it is preferred that the zeta potential of the colloidal silica particles after the three-step filtration test is less than 10 mV (or less than 7 mV, or less than 5 mV, or less than 2 mV) less than the zeta potential of the colloidal silica particles in the original polishing composition. For example, in an embodiment in which the zeta potential of the colloidal silica particles in the original polishing composition is 30 mV, the zeta potential of the colloidal silica particles after the three-step filtration test is preferably greater than 20 mV (or greater than 23 mV, or greater than 25 mV, or greater than 28 mV).

The polishing composition may be acidic having a pH of less than about 7, e.g., in the range from about 1.5 to about 7. Polishing compositions used for bulk tungsten removal may have a pH of about 1 or more (e.g., about 1.5 or more, or about 2 or more). Preferably, such polishing compositions have a pH of about 6 or less (e.g., about 5 or less, or about 4 or less). More preferably, such polishing compositions may have a pH in a range from about 1 to about 6 (e.g., from about 1.5 to about 5, or from about 2 to about 4, or from about 2 to about 3.5). Polishing compositions used for a tungsten buffing operation may have a pH of about 2 or more (e.g., about 2.5 or more, or about 3 or more). Preferably, such compositions may have a pH of about 6 or less (e.g., about 5 or less, or about 4.5 or less). More preferably, such polishing compositions have a pH in a range from about 2 to about 6 (e.g., from about 2.5 to about 5, or from about 3 to about 4.5).

The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

Optional embodiments of the polishing composition may further include an iron containing accelerator. An iron containing accelerator as used herein is an iron containing chemical compound that increases the removal rate of tungsten during a tungsten CMP operation. For example, the iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle. In one embodiment the iron containing accelerator may include a boron containing stabilizer and an iron containing catalyst. In such embodiments the stabilizer and catalyst may occupy substantially any percentage of the available surface sites on the colloidal silica particles, for example, greater than 1%, greater than 50%, or greater than 80% of the available surface sites.

The amount of iron containing accelerator in the polishing composition may be varied depending upon the oxidizing agent used, if present, (optional oxidizing agents are disclosed in more detail below) and the chemical form of the accelerator. When the preferred oxidizing agent hydrogen peroxide (or its analogs) is used and a soluble iron containing catalyst is used (such as ferric nitrate), the catalyst may be present in the composition in an amount sufficient to provide a range from about 0.1 to about 3000 ppm Fe based on the total weight of the composition. The polishing composition preferably includes about 1 ppm Fe or more (e.g., about 5 ppm or more, about 10 ppm or more, or about 20 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 3 to about 200 ppm, from about 5 to about 100 ppm, or from about 10 to about 50 ppm).

Embodiments of the polishing composition including an iron containing accelerator may further include a stabilizer. Without such a stabilizer, the iron containing accelerator and the oxidizing agent, if present, may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agents is hydrogen peroxide.

The oxidizing agent may be present in the polishing composition in an amount ranging, for example, from about 0.1 to about 10 weight percent. In preferred embodiments in which a hydrogen peroxide oxidizer and a soluble iron containing accelerator are used, the oxidizer may be present in the polishing composition in an amount ranging from about 0.1 to about 6 weight percent (e.g., from about 0.2 to about 5 weight percent, from about 0.3 to about 4 weight percent, or from about 0.5 to about 3 weight percent).

The polishing composition may optionally further include a compound that inhibits tungsten etching. Suitable inhibitor compounds inhibit the conversion of solid tungsten into soluble tungsten compounds while at the same time allowing for effective removal of solid tungsten via the CMP operation. Classes of compounds that are useful inhibitors of tungsten etching include compounds having nitrogen-containing functional groups such as nitrogen-containing heterocycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cysteine, and glycine (aminoacetic acid).

The inhibitor compound may alternatively and/or additionally include an amine compound in solution in the liquid carrier. The amine compound (or compounds) may include a primary amine, a secondary amine, a tertiary amine, or a quaternary amine. The amine compound may further include a monoamine, a diamine, a triamine, a tetramine, or an amine based polymer having a large number of repeating amine groups (e.g., 4 or more amine groups).

In certain embodiments of the polishing composition the amine compound may include a long chain alkyl group. By long chain alkyl group it is meant that the amine compound includes an alkyl group having at least 10 carbon atoms (e.g., at least 12 carbon atoms or at least 14 carbon atoms). Such amine compounds may include, for example, dodecylamine, tetradecylamine, hexadecylamine, octadecylamine, oleylamine, N-methyldioctylamine, N-methyl-octadecylamine, cocamidopropylamine oxide, benzyldimethylhexadecylammonium chloride, benzalkonium chloride, cocoalkylmethyl[polyoxyethylene(15)]ammonium chloride, octadecylmethyl[polyoxyethylene(15)]ammonium chloride, cetyltrimethylammonium bromide, and the like.

In certain embodiments of the polishing composition the amine compound may include a polycationic amine. A polycationic amine (as the term is used herein) is an amine compound having multiple (two or more) amine groups in which each of the amine groups is cationic (i.e., has a positive charge). Thus the polycationic amine may include a polyquaternary amine. By polyquaternary amine it is meant that the amine compound includes from 2 to 4 quaternary ammonium groups such that the polyquaternary amine is a diquaternary amine, a triquaternary amine, or a tetraquaternary amine compound. Diquaternary amine compounds may include, for example, N,N'-methylenebis(dimethyltetradeclammonium bromide), 1,1,4,4-tetrabutylpiperazinediium dibromide, N,N,N',N',N'-pentamethyl-N-tallow-1,3-propane-diammonium dichloride, N,N'-hexamethylenebis (tributylammonium hydroxide), decamethonium bromide, didodecyl-tetramethyl-1,4-butanediaminium diiodide, 1,5-dimethyl-1,5-diazoniabicyclo(3.2.2)nonane dibromide, and the like. Triquaternary amine compounds may include, for example, N(1),N(6)-didoecyl-N(1),N(1),N(6),N(6)-tetramethyl-1,6-hexanediaminium diiodide. Tetraquaternary amine compounds may include, for example, methanetetrayltetrakis(tetramethylammonium bromide). The polyquaternary amine compound may further include a long chain alkyl group (e.g., having 10 or more carbon atoms). For example, a polyquaternary amine compound having a long chain alkyl group may include N,N'-methylenebis (dimethyltetradec-lammonium bromide), N,N,N',N',N'-pentamethyl-N-tallow-1,3-propane-diammonium dichloride, didodecyl-tetramethyl-1,4-butanediaminium diiodide, and N(1),N(6)-didodecyl-N(1),N(1),N(6),N(6)-tetramethyl-1,6-hexanediaminium diiodide.

A polycationic amine may also be polycationic in that each of the amine groups is protonated (and therefore has a positive charge). For example, a dicationic amine such as tetramethyl-p-phenylenediamine includes two tertiary amine groups that may be protonated (and therefore positively charged) at polishing composition pH values less than the pKa of the amine compound.

In certain embodiments of the polishing composition the amine compound may include an amine based polymer. Such a polymer includes four or more amine groups. The amine based polymer may include, for example, triethylenetetramine, tetraethylenepentamine, pentaethylenehexamine, and polymers including the following amine containing functional groups methacryloylox-ethyl trimethyl ammonium methylsulfate, diallyl dimethyl ammonium chloride, and methacrylamido-propyl trimethyl ammonium chloride.

The polishing composition may include any suitable concentration of the inhibitor compound. In general the concentration is desirably high enough to provide adequate etch inhibition, but low enough so that the compound is soluble and so as not to reduce tungsten polishing rates below acceptable levels. By soluble it is meant that the compound is fully dissolved in the liquid carrier or that it forms micelles in the liquid carrier or is carried in micelles. It may be necessary to vary the concentration of the inhibitor compound depending upon numerous various factors, for example, including the solubility thereof, the number of amine groups therein, the length of an alkyl group, the relationship between etch rate inhibition and polishing rate inhibition, the oxidizing agent used, the concentration of the oxidizing agent, and so on. In certain desirable embodiments, the concentration of an amine compound in the polishing composition may be in a range from about 0.1 µM to about 10 mM (i.e., from about $10^{-7}$ to about $10^{-2}$ molar). For example, in embodiments utilizing an amine based polymer having a high molecular weight, the concentration may be on the lower end of the range (e.g., from about $10^{-7}$ to about $10^{-4}$ molar). In other embodiments utilizing a comparatively simple amine compound (having fewer amine groups and a lower molecular weight), the concentration may be on the higher end of the range (e.g., from about $10^{-5}$ to about $10^{-2}$ molar).

In certain chemical-mechanical polishing applications (e.g., shallow trench applications) tungsten and silicon oxide may be polished in combination with a silicon nitrogen material such as silicon nitride (SiN). In particular applications it may be desirable to achieve a high removal rate for both the silicon oxygen material and the silicon nitrogen material (e.g., such that a TEOS:SiN polishing rate selectivity is less than about 15:1 and such that the TEOS and SiN polishing rates are greater than the tungsten polishing rate). The chemical-mechanical polishing composition may therefore optionally further include a silicon nitrogen polishing accelerator. The silicon nitrogen polishing accelerator may include, for example, substantially any suitable poly acid such as polycarboxylic acids and/or poly phosphonic acids. Example polycarboxylic acids may include, for example, oxalic acid, malonic acid, succinic acid, glutaric acid, adipic acid, tartaric acid, sulfosuccinic acid, and/or phthalic acid. It will be understood that such polycarboxylic acids may generally be used in their conjugate form, e.g., the carboxylate can be used instead of the carboxylic acid. The term "acid" as used herein to describe useful silicon nitrogen accelerators also means the conjugate base (or bases) of the acid.

Suitable poly phosphonic acids may include for example, methylene phosphonic acid compounds and diphosphonic acid compounds such as 1-hydroxyethylidene-1,1,-diphosphonic acid, amino tri(methylene phosphonic acid), diethylenetriamine penta(methylene phosphonic acid), and bis(hexamethylene triamine penta(methylenephosphonic acid)). It will be understood that such poly phosphonic acids may generally be used in their conjugate form, e.g., the phosphonate can be used instead of the phosphonic acid (as described above with respect to the carboxylic acids). Suitable examples of the above described poly phosphonic acid compounds are sold under the Dequest® trade name (Italmatch Chemicals, Genova, Italy).

The chemical-mechanical polishing composition may optionally further include a uniformity additive for improving the within wafer uniformity of the polishing rate (e.g., a wafer edge to center polishing rate ratio or difference). The uniformity additive may include, for example, polyethers such as polyethylene glycol and polyether amine, polyalcohols such as ethylene glycol, propylene glycol, and polyvinyl alcohol, and/or amine containing compounds such as an aminophenol, a hydroxypyridine, and cetyl trimethylammonium bromide.

Certain embodiments of the disclosed polishing compositions have been observed to achieve a higher silicon dioxide (TEOS) polishing rate when the electrical conductivity of the polishing composition is low. Such embodiments may be advantageously utilized for tungsten buffing applications. Example polishing compositions may therefore advantageously have an electrical conductivity of less than 2000 µS/cm (e.g., less than 1500 µS/cm, less than 1000 µS/cm, less than 800 µS/cm, less than 500 µS/cm, less than 400 µS/cm, or less than 300 µS/cm).

The polishing composition may optionally further include a biocide. The biocide may be any suitable biocide, for example an isothiazolinone biocide. The amount of biocide in the polishing composition may be in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica, the iron containing accelerator, the stabilizer, the amine compound, etc.).

The colloidal silica abrasive particles may be grown in the aqueous liquid carrier, for example, as described above. The resulting dispersion may then be diluted and the pH adjusted to a predetermined value, for example, via adding an acid. Other optional components such as an iron containing accelerator and a stabilizer may then be added and mixed by any method that is capable of incorporating the components into the polishing composition. The oxidizing agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may be prepared by mixing the components at the surface of the substrate (e.g., on the polishing pad) during the CMP operation.

The polishing composition may be supplied as a one-package system comprising the colloidal silica having the internal chemical species (e.g., the aminosilane compound), the iron containing accelerator, an optional stabilizer, an optional biocide, and water. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may advantageously be provided as a concentrate which is intended to be diluted with an appropriate amount of water prior to use. In such an embodiment, the polishing composition concentrate may include the colloidal silica abrasive particles having a positively charged species incorporated therein as described above and other optional additives in amounts such that, upon dilution of the concentrate with an appropriate amount of water each component of the polishing composition will be present in the polishing composition in an amount within the appropriate range recited above for each component. For example, the colloidal silica abrasive particles may be present in the polishing composition in an amount that is about 2 times (e.g., about 3 times, about 4 times, about 5 times, or even about 10 times) greater than the concentration recited above for each component so that when the concentrate is diluted with an equal volume of (e.g., 2 equal volumes of water, 3 equal volumes of water, 4 equal volumes of water, or even 9 equal volumes of water respectively) each component will be present in the polishing composition in an amount within the ranges set forth above. Furthermore, as will be understood by those of ordinary skill in the art, the concentrate may contain an appropriate fraction of the water present in the final polishing composition in order to ensure that other components are at least partially or fully dissolved in the concentrate.

In one embodiment, a suitable concentrate includes at least 10 weight percent of one of the above described colloidal silica abrasive particles dispersed in a water based liquid carrier (e.g., a colloidal silica including a nitrogen-containing compound such as an aminosilane compound or a phosphorus-containing compounds such as a phosphonium silane compound incorporated internal to an outer surface of the particles). The colloidal silica particles may optionally have a permanent positive charge of at least 10 mV. The concentrated composition may further includes an iron containing accelerator and other optional components described above. Moreover, the pH of the composition may be in a range from about 2 to about 4.5.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium and titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

In one embodiment a method of chemical-mechanical polishing a substrate including tungsten and a silicon oxygen material (such as TEOS) makes use of one of the disclosed polishing compositions, for example, having an acidic pH and less than about 4 weight percent of the colloidal silica abrasive particles. In such an embodiment, an average removal rate of TEOS may be greater than 1000 Å/min at 2.0 psi downforce (or even greater than 1300 Å/min). Moreover, the removal rate of TEOS may be greater than the removal rate of tungsten (i.e., the TEOS:W selectivity may be greater than 1). In an embodiment in which the substrate further includes a silicon nitrogen material the removal rate of the silicon nitrogen material may also be greater than the removal rate of tungsten.

In another embodiment a method of chemical-mechanical polishing a substrate including tungsten and a silicon oxygen material (such as TEOS) makes use of one of the disclosed polishing compositions, for example, having a pH less than 4 and less than about 2 weight percent of the colloidal silica abrasive particles. In such an embodiment, an average removal rate of tungsten may be greater than 2000 Å/min at a downforce of 2.5 psi (or even greater than 2300 Å/min). Moreover, the removal rate of TEOS may be less than 50 Å/min at a downforce of 1.5 psi (or less than 30 Å/min) such that a W:TEOS selectivity is greater than 40:1. Such polishing rates may be achieved on wafers having substantially any suitable diameter, for example, on 200 mm diameter wafers, 300 mm diameter wafers, or 450 mm diameter wafers.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

It will be understood that the disclosure includes numerous embodiments. These embodiments include, but are not limited to, the following embodiments.

In a first embodiment, a chemical-mechanical polishing composition may include a water based liquid carrier; colloidal silica abrasive particles dispersed in the liquid carrier; an aminosilane compound or a phosphonium silane compound incorporated in the colloidal silica abrasive particles internal to an outer surface thereof; an iron containing accelerator; and a pH in a range from about 1.5 to about 7.

In a second embodiment, a chemical-mechanical polishing composition may include a water based liquid carrier; colloidal silica abrasive particles dispersed in the liquid carrier; a chemical species incorporated in the colloidal silica abrasive particles internal to an outer surface thereof, wherein the chemical species is a nitrogen-containing compound or a phosphorus-containing compound; an iron containing accelerator; and a pH in a range from about 2 to about 4.5.

A third embodiment may include the first or second embodiment wherein the colloidal silica abrasive particles have a permanent positive charge of at least 10 mV.

A fourth embodiment may include the first or second embodiment wherein the colloidal silica abrasive particles have a permanent positive charge of at least 15 mV.

A fifth embodiment may include any one of the first through fourth embodiments wherein the colloidal silica abrasive particles have a mean particle size in a range from about 30 to about 70 nm.

A sixth embodiment may include any one of the first through fourth embodiments wherein the colloidal silica abrasive particles have a mean particle size in a range from about 40 to about 60 nm.

A seventh embodiment may include any one of the first through sixth embodiments comprising from about 0.2 to about 2 weight percent of the colloidal silica abrasive particles.

An eighth embodiment may include any one of the first through sixth embodiments comprising from about 1 to about 4 weight percent of the colloidal silica abrasive particles.

A ninth embodiment may include any one of the first through eighth embodiments wherein 30 percent or more of the colloidal silica abrasive particles include three or more aggregated primary particles.

A tenth embodiment may include any one of the first through eighth embodiments wherein 50 percent or more of the colloidal silica abrasive particles include three or more aggregated primary particles and 20 percent or more of the colloidal silica abrasive particles are monomers or dimers.

An eleventh embodiment may include any one of the first and third through tenth embodiments wherein the aminosilane compound comprises a propyl group, primary amine, or quaternary amine.

A twelfth embodiment may include any one of the first and third through eleventh embodiments wherein the aminosilane compound comprises bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl)propyl)-ethylenediamine, bis (trialkoxysilylpropyl)amine, bis(trialkoxysilylpropyl)amine, 3-aminopropyltrialkoxysilane, N-(2-Aminoethyl)-3-aminopropylmethyldialkoxysilane, N-(2-Aminoethyl)-3-aminopropyltrialkoxysilane, 3-Aminopropylmethyldialkoxysilane, 3-Aminopropyltrialkoxysilane, (N-Trialkoxysilylpropyl)polyethyleneimine, Trialkoxysilylpropyldiethylenetriamine, N-Phenyl-3-aminopropyltrialkoxysilane, N-(Vinylbenzyl)-2-aminoethyl-3-aminopropyltrialkoxysilane, 4-Aminobutyltrialkoxysilane, or a mixture thereof.

A thirteenth embodiment may include any one of the first and third through twelfth embodiments having a pH in a range from about 2.0 to about 4.5.

A fourteenth embodiment may include any one of the first through thirteenth embodiments wherein the iron containing accelerator comprises a soluble iron containing catalyst.

A fifteenth embodiment may include the fourteenth embodiment further comprising a stabilizer bound to the soluble iron containing catalyst, the stabilizer being selected from the group consisting of phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

A sixteenth embodiment may include any one of the first through fifteenth embodiments further comprising a hydrogen peroxide oxidizer.

A seventeenth embodiment may include any one of the first through sixteenth embodiments having an electrical conductivity of less than 1000 µS/cm.

An eighteenth embodiment may include any one of the first through seventeenth embodiments further comprising an amine compound in solution in the liquid carrier.

A nineteenth embodiment may include the eighteenth embodiment wherein the amine compound comprises an alkyl group having 12 or more carbon atoms.

A twentieth embodiment a include the eighteenth embodiment wherein the amine compound is a polyquaternary amine compound.

A twenty-first embodiment may include the eighteenth embodiment wherein the amine compound is an amine containing polymer having four or more amine groups.

A twenty-second embodiment may include any one of the first through twenty-first embodiments wherein the colloidal silica abrasive particles have a core-shell structure in which an outer shell is disposed over an inner core, the aminosilane compound or the chemical species being incorporated in the outer shell.

A twenty-third embodiments may include any one of the first through twenty-second embodiments wherein the colloidal silica abrasive particles have a density of greater than 1.90 g/cm$^3$.

The twenty-fourth embodiment may include any one of the first through twenty-third embodiments wherein a molar ratio of the aminosilane compound or the chemical species to silica in the colloidal silica abrasive particles is less than 10 percent.

A twenty-fifth embodiment may include one of the first or second embodiments wherein: the colloidal silica abrasive particles have a permanent positive charge of at least 10 mV; the iron containing accelerator comprises a soluble iron containing catalyst; the composition further comprises a stabilizer bound to the soluble iron containing catalyst; the composition further comprises an amine compound in solution in the liquid carrier; 30 percent or more of the colloidal silica abrasive particles include three or more aggregated primary particles; and the composition has a pH in a range from about 2 to about 3.5.

A twenty-sixth embodiment may include twenty-fifth embodiment further comprising from about 0.2 to about 2 weight percent of the colloidal silica abrasive particles.

A twenty-seventh embodiments may include one of the first or second embodiments wherein the colloidal silica abrasive particles have a permanent positive charge of at least 10 mV; the iron containing accelerator comprises a soluble iron containing catalyst; the composition further comprises a stabilizer bound to the soluble iron containing catalyst; the composition further comprises an amine compound in solution in the liquid carrier; 30 percent or more of the colloidal silica abrasive particles include three or more aggregated primary particles; and the composition has a pH in a range from about 3 to about 4.5 and an electrical conductivity of less than about 1000 µS/cm.

A twenty-eight embodiment may include the twenty-seventh embodiment further comprising from about 1 to about 4 weight percent of the colloidal silica abrasive particles.

A first method of chemical-mechanical polishing a substrate including a tungsten layer may include: (a) contacting the substrate with a chemical-mechanical polishing composition including any one of the first through twenty-eighth embodiments; (b) moving the polishing composition relative to the substrate; and (c) abrading the substrate to remove a portion of the tungsten layer from the substrate and thereby polish the substrate.

A second method of chemical-mechanical polishing may include the first method wherein: the substrate further comprises a silicon oxygen material; and a rate of removal of the silicon oxygen material in (c) is greater than or equal to a rate of removal of tungsten in (c).

A third method of chemical-mechanical polishing may include the second method wherein: the substrate further comprises a silicon nitrogen material; and a rate of removal of the silicon nitrogen material in (c) is greater than or equal to a rate of removal of tungsten in (c).

A fourth method of chemical-mechanical polishing may include the first method wherein: the substrate further comprises a silicon oxygen material; and a rate of removal of tungsten in (c) is at least 40 times greater than a removal rate of the silicon oxygen material in (c).

A method for manufacturing a chemical-mechanical polishing composition may include: (a) providing a liquid solution; (b) combining the liquid solution, a silica producing compound, and an aminosilane compound thereby causing colloidal silica particles to grow such that a dispersion is obtained including colloidal silica particles having the aminosilane compound incorporated therein; (c) admixing an iron containing accelerator to the dispersion; and (d) adjusting the pH of the dispersion to value in a range from about 2 to about 4.5.

The following examples further illustrate the invention but, of course, should not be construed as in any way limiting its scope. In these examples, reported zeta potentials values were measured using the Model DT-1202 Acoustic and Electro-acoustic spectrometer (available from Dispersion Technologies) and reported particles size values were measured using the Zetasizer® available from Malvern Instruments®.

Example 1

The tungsten and silicon oxide (TEOS) polishing rate were evaluated in this example for various polishing compositions. This example demonstrates the effect of the colloidal silica, the iron containing accelerator, the oxidizer and the mean particle size of the colloidal silica on the tungsten and TEOS polishing rates. Each of polishing compositions 1A-1E included colloidal silica abrasive particles having a core shell structure in which a hydrolyzed or partially hydrolyzed aminopropyl trialkoxysilane (an aminosilane) was incorporated in the shell using a procedure similar to that described below in Example 11. Compositions 1A-1C and 1E had a mean particle size of 60 nm while composition 1D had a mean particle size of 48 nm. Polishing composition 1F included PL2 colloidal silica available from Fuso Chemical Company (Tokyo, Japan). Concentrated dispersions including the above described colloidal silica abrasive particles were added to mixtures of ferric nitrate nonahydrate $(Fe(NO_3)_3 \cdot 9H_2O)$ and water to obtain the corresponding polishing compositions. Hydrogen peroxide was then added to compositions 1C-1E. Each of compositions 1A-1F included one weight percent of the colloidal silica. Table 1A lists the colloidal silica particle size, and the concentrations of hydrogen peroxide and $Fe(NO_3)_3 \cdot 9H_2O$.

TABLE 1A

| CMP Composition | Particle Size (nm) | $Fe(NO_3)_3 \cdot 9H_2O$ (ppm) | Hydrogen Peroxide (wt. %) |
| --- | --- | --- | --- |
| 1A | 60 | 0 | 0 |
| 1B | 60 | 30 | 0 |
| 1C | 60 | 30 | 2 |
| 1D | 48 | 30 | 2 |
| 1E | 60 | 60 | 2 |
| 1F | 50 | 0 | 0 |

The tungsten and TEOS polishing rates were obtained by polishing two-inch (50 mm) wafers having either a tungsten or a TEOS layer using a Logitech Model II CDP Polisher (Logitech Ltd., Glasgow, UK) and an IC1010 polishing pad at a down-force of 3 psi, a platen speed of 100 rpm, and a slurry flow rate of 125 ml/min. The polishing rates are shown in Table 1B.

TABLE 1B

| CMP Composition | TEOS Rate (Å/min) | Tungsten Rate (Å/min) |
| --- | --- | --- |
| 1A | 1660 | 17 |
| 1B | 2060 | 23 |
| 1C | 1980 | 900 |
| 1D | 1980 | 750 |
| 1E | 630 | 910 |
| 1F | 70 | 0 |

As is apparent from the results set forth in Table 1B, high TEOS rates may be achieved using various formulations (1A-1D). High tungsten rates were also achieved in formulations including an iron containing accelerator and an oxidizer (1C-1E).

Example 2

The tungsten etch rate, zeta potential of the colloidal silica, and electrical conductivity of the polishing composition were evaluated in this example for various polishing compositions. This example demonstrates the effect of various tungsten etch inhibitors on these metrics. Each of polishing compositions 2A-2K included colloidal silica abrasive particles having a core shell structure in which a hydrolyzed or partially hydrolyzed aminopropyl trialkoxysilane was incorporated in the shell using a procedure similar to that described below in Example 11. A concentrated dispersion including the above described colloidal silica abrasive particles was then added to a mixture including malonic acid, ferric nitrate nonahydrate $(Fe(NO_3)_3 \cdot 9H_2O)$, and water such that the final concentrations in the compositions were as follows: 1.0 weight percent colloidal silica, 30 ppm ferric nitrate nonahydrate, and 61.8 ppm malonic acid. The pH of each composition was then adjusted to 4.0 using nitric acid.

The concentration of each additive (etch inhibitor) is listed as follows: (2A) no additive, (2B) 30 ppm polyquaternium-10 (available as Celquat® SC-240), (2C) 800 ppm glycine, (2D) 800 ppm lysine, (2E) 30 ppm cetyl trimethylammonium bromide, (2F) 30 ppm isostearamidopropyl laurylacetodimonium chloride (available Schercoquat® IALA), (2G) 30 ppm hydroxylated polyether quaternary ammonium chloride, (2H) 30 ppm N,N,N',N',N'-pentamethyl-N-tallow-1,3-propane-diammonium dichloride, (2I) 30 ppm quaternary polyvinylimidazole, (2J) 30 ppm Silquat® 3152, and (2K) 30 ppm cocoyl sarcosine (available as Perlastan® C).

To obtain the tungsten etch rate for each polishing composition, the composition was first heated to 45 degrees C. after which hydrogen peroxide was added to a concentration of 2 percent. After waiting 5 minutes for the temperature to return to 45 degrees C., a two-inch wafer having a tungsten layer was submersed in the polishing compositions for 5 minutes. Tungsten removal rates were determined via resistivity measurements made before and after immersion in the polishing compositions. The electrical conductivity, zeta potential and tungsten etch rate for each polishing composition are given in Table 2.

TABLE 2

| CMP Composition | Conductivity (µS/cm) | Zeta Potential (mV) | Tungsten Etch Rate (Å/min) |
|---|---|---|---|
| 2A | 164 | 29 | 207 |
| 2B | 171 | 31 | 199 |
| 2C | 239 | 29 | 66 |
| 2D | 678 | 22 | 57 |
| 2E | 210 | 32 | 190 |
| 2F | 211 | 32 | 189 |
| 2G | 209 | 32 | 187 |
| 2H | 194 | 32 | 113 |
| 2I | 193 | 34 | 190 |
| 2J | 223 | 32 | 165 |
| 2K | 202 | 31 | 204 |

As is apparent from the results set forth in Table 2, various tungsten etch inhibitors may be used in combination with the colloidal silica to reduce the tungsten etch rate without significantly effecting the zeta potential.

Example 3

The tungsten and silicon oxide (TEOS) polishing rate were evaluated in this example for various polishing compositions. This example demonstrates the effect of the iron concentration and various tungsten etch inhibitors on the polishing rates. Each of polishing compositions 3A-3I included colloidal silica abrasive particles having a core shell structure in which a hydrolyzed or partially hydrolyzed aminopropyl trialkoxysilane was incorporated in the shell using a procedure similar to that described below in Example 11. Concentrated dispersions including the above described colloidal silica abrasive particles were then added to mixtures including malonic acid, ferric nitrate nonahydrate ($Fe(NO_3)_3 \cdot 9H_2O$), and water to obtain the various polishing compositions. A corresponding tungsten etch inhibitor was added to each composition. Each of the compositions included 0.5 weight percent because of the colloidal silica abrasive having a mean particle size of about 55 nm. Each composition further included 2.0 weight percent hydrogen peroxide, and 8.0 equivalents of malonic acid per ferric ion, at a pH of 3.0 (adjusted using nitric acid). Table 3A lists the concentration of $Fe(NO_3)_3 \cdot 9H_2O$ and the tungsten etch inhibitor for each of the compositions 3A-3I.

TABLE 3A

| CMP Composition | $Fe(NO_3)_3 \cdot 9H_2O$ (ppm) | Tungsten Etch Inhibitor (ppm or wt. %) |
|---|---|---|
| 3A | 70 | 0.1 wt % lysine |
| 3B | 80 | 0.12 wt % arginine |
| 3C | 100 | 0.11 wt. % histidine |
| 3D | 40 | 770 ppm proline |
| 3E | 65 | 30 ppm 1-benzyl-3-methylimidazolium chloride |
| 3F | 60 | 0.1 wt % lysine |
| 3G | 60 | 0.1 wt % lysine + 200 ppm phloroglucinol dehydrate |
| 3H | 35 | 50 ppm diflurophenyl-1H-imidazole |
| 3I | 35 | 50 ppm diododecyl tetramethyl hexanediaminium |

The tungsten and TEOS polishing rates were obtained using a Mirra® CMP Tool. 200 mm (eight inch) wafers having either a tungsten layer or a TEOS layer deposited on a surface thereof were polished on an IC1010 polishing pad. The tungsten wafers were polished at a downforce of 3.5 psi and 2.0 psi while the TEOS wafers were polished at a downforce of 1.5 psi. All wafers were polished at a platen speed of 100 rpm, and a slurry flow rate of 150 ml/min. The polishing rates are shown in Table 3B.

TABLE 3B

| CMP Composition | Tungsten Rate 3.5 psi (Å/min) | Tungsten Rate 2.0 psi (Å/min) | TEOS Rate 1.5 psi (Å/min) |
|---|---|---|---|
| 3A | 1440 | 440 | 26 |
| 3B | 1490 | 520 | 26 |
| 3C | 1740 | 620 | 22 |
| 3D | 1810 | 820 | 24 |
| 3E | 2900 | 1450 | 26 |
| 3F | 1220 | 390 | 28 |
| 3G | 1290 | 390 | 28 |
| 3H | 2190 | NA | 24 |
| 3I | 2290 | NA | 16 |

As is apparent from the results set forth in Table 3B, high tungsten removal rates and a high W:TEOS selectivity (e.g., greater than 40:1, 70:1 or even 100:1) may be achieved using polishing compositions including the colloidal silica disclosed herein and various tungsten etch inhibitors.

Example 4

The tungsten, titanium, and silicon oxide (TEOS) polishing rates as well oxide erosion were evaluated in this example for two polishing compositions. This example demonstrates the effect colloidal silica abrasive particles on these metrics. Polishing composition 4A included colloidal silica abrasive particles having a core shell structure in which a hydrolyzed or partially hydrolyzed aminopropyl trialkoxysilane was incorporated in the shell using a procedure similar to that described below in Example 11. The mean particle size was about 55 nm. A concentrated dispersion including the above described colloidal silica abrasive particles was then added to a mixture including malonic acid, ferric nitrate nonahydrate, and water. The control composition included a 100 nm colloidal silica that was surface treated with 3-(aminopropyl)trimethoxylsilane. Each of the polishing compositions included 0.5 weight percent of the corresponding colloidal silica. The polishing compositions further included 2.0 weight percent hydrogen peroxide, 307 ppm Fe(NO$_3$)$_3$.9H$_2$O, 668 ppm malonic acid, 40 ppm of a tungsten etch inhibitor, and 8 ppm of a Kathon® biocide, at a pH of 2.3 (adjusted using nitric acid).

The polishing rates were obtained by polishing 300 mm (12 inch) diameter wafers having the appropriate layers using a Reflexion® CMP tool and an IC1010 polishing pad at downforces of 2.5 psi and 1.5 psi. The platen speed was 100 rpm and the slurry flow rate was 200 ml/min. The oxide erosion values were obtained by polishing 300 mm MIT854 patterned wafers (available from Silyb Wafer Services). Each patterned wafer was polished for 25 seconds at 2.0 psi and 45 seconds at 1.5 psi (to endpoint). The polishing rates are shown in Table 4A. The oxide erosion values are shown in Table 4B.

TABLE 4A

| Polishing | Polishing Rates (Å/min) | | | |
|---|---|---|---|---|
| Composition | W 2.5 psi | W 1.5 psi | Ti 1.5 psi | TEOS 1.5 psi |
| 4A | 2650 | 970 | 830 | 24 |
| Control | 2470 | 830 | 810 | 30 |

TABLE 4B

| | Oxide Erosion (Å) | | |
|---|---|---|---|
| Polishing Composition | 75% PD 1.5 × 0.5 µm | 90% PD 9 × 1 µm | 75% PD 7 × 3 µm |
| 4A | 47 | 227 | 62 |
| Control | 108 | 385 | 115 |

As is apparent from the results set forth in Tables 4A and 4B, the use of a colloidal silica having an internal aminosilane (as disclosed herein) provides improved tungsten removal rates, improved titanium removal rate, a reduced TEOS removal rate, and reduced oxide erosion as compared with an identical composition including an aminosilane surface treated colloidal silica.

Example 5

The tungsten and silicon oxide (TEOS) polishing rates were evaluated in this example for two polishing compositions. This example demonstrates the effect of the iron concentration and the tungsten etch inhibitor concentration on the tungsten and TEOS polishing rates. Polishing compositions 5A-5F included colloidal silica abrasive particles having a core shell structure in which a hydrolyzed or partially hydrolyzed aminopropyl trialkoxysilane was incorporated in the shell using a procedure similar to that described below in Example 11. A concentrated dispersion including the above described colloidal silica abrasive particles was then added to a mixture including malonic acid, ferric nitrate nonahydrate (Fe(NO$_3$)$_3$.9H$_2$O), and water. Each composition included 2.0 weight percent of the colloidal silica having a mean particle size of about 55 nm. The compositions further included 2.0 weight percent hydrogen peroxide, and a fixed molar ratio of malonic acid to Fe(NO$_3$)$_3$.9H$_2$O of 8:1, at a pH of 4.0. The concentration of Fe(NO$_3$)$_3$.9H$_2$O and a tungsten etch inhibitor are shown in Table 5A.

TABLE 5A

| CMP Composition | Fe(NO$_3$)$_3$•9H$_2$O (ppm) | Tungsten Etch Inhibitor (ppm) |
|---|---|---|
| 5A | 45 | 50 |
| 5B | 45 | 37 |
| 5C | 60 | 37 |
| 5D | 60 | 50 |
| 5E | 45 | 63 |
| 5F | 60 | 63 |

The polishing rates were obtained by polishing 300 mm (12 inch) diameter wafers having the appropriate layers using a Reflexion® CMP tool and an IC1010 polishing pad at downforces of 1.0, 2.0, and 3.0 psi. The platen speed was 100 rpm and the slurry flow rate was 200 ml/min. The tungsten and TEOS polishing rates are shown in Table 5B. The TEOS to tungsten selectivities are given in Table 5C.

TABLE 5B

| CMP | Tungsten Rate (Å/min) | | | TEOS Rate (Å/min) | | |
|---|---|---|---|---|---|---|
| Composition | 1.5 psi | 2.0 psi | 3.0 psi | 1.5 psi | 2.0 psi | 3.0 psi |
| 1A | 380 | 980 | 2130 | 1090 | 1750 | 2090 |
| 1B | 720 | 1070 | 2010 | 1070 | 1710 | 2320 |
| 1C | 1270 | 1340 | 2610 | 1060 | 1710 | 2200 |
| 1D | 480 | 1140 | 2730 | 1080 | 1640 | 2060 |
| 1E | 270 | 800 | 1390 | 1100 | 1600 | 2070 |
| 1F | 300 | 850 | 1660 | 1100 | 1670 | 2000 |

TABLE 5C

| CMP | TEOS: Tungsten Selectivity | | |
|---|---|---|---|
| Composition | 1.5 psi | 2.0 psi | 3.0 psi |
| 1A | 2.9 | 1.8 | 1.0 |
| 1B | 1.5 | 1.6 | 1.2 |
| 1C | 0.8 | 1.3 | 0.8 |
| 1D | 2.3 | 1.4 | 0.8 |
| 1E | 4.1 | 2.0 | 1.5 |
| 1F | 3.7 | 2.0 | 1.2 |

As is apparent from the results set forth in Tables 5B and 5C, high TEOS removal rates can be achieved such that the TEOS:W selectivity may be in a range from about 4:1 to about 0.8:1. In this example the TEOS removal rates are generally greater than the tungsten removal rates.

Example 6

The tungsten and silicon oxide (TEOS) polishing rates were evaluated in this example for two polishing compositions. This example demonstrates the effect of the iron concentration and the tungsten etch inhibitor concentration on the tungsten and TEOS polishing rates. Polishing compositions 6A-6E included colloidal silica abrasive particles having a core shell structure in which a hydrolyzed or partially hydrolyzed aminopropyl trialkoxysilane was incorporated in the shell using a procedure similar to that described below in Example 11. A concentrated dispersion including the above described colloidal silica abrasive particles was then added to a mixture including malonic acid, ferric nitrate nonahydrate (Fe(NO$_3$)$_3$.9H$_2$O), and water. Each composition included 3.0 weight percent of the colloidal silica having a mean particle size of about 55 nm. The compositions further included a fixed molar ratio of malonic acid to Fe(NO$_3$)$_3$.9H$_2$O of 8:1, and 37 ppm of a tungsten etch inhibitor, at a pH of 4.0. The concentration of Fe(NO$_3$)$_3$·9H$_2$O and hydrogen peroxide are shown in Table 6A.

TABLE 6A

| CMP Composition | Fe(NO$_3$)$_3$·9H$_2$O (ppm) | Hydrogen Peroxide (wt. %) |
|---|---|---|
| 6A | 60 | 2 |
| 6B | 60 | 4 |
| 6C | 75 | 3 |
| 6D | 90 | 2 |
| 6E | 90 | 4 |

The polishing rates were obtained by polishing 300 mm (12 inch) diameter wafers having the appropriate layers using a Reflexion® CMP tool and an IC1010 polishing pad at downforces of 1.0, 1.5, and 2.0 psi. The platen speed was 100 rpm and the slurry flow rate was 200 ml/min. The tungsten and TEOS polishing rates are shown in Table 6B. The TEOS to tungsten selectivities are given in Table 6C.

TABLE 6B

| CMP Composition | Tungsten Rate (Å/min) | | | TEOS Rate (Å/min) | | |
|---|---|---|---|---|---|---|
| | 1.0 psi | 1.5 psi | 2.0 psi | 1.0 psi | 1.5 psi | 2.0 psi |
| 6A | 690 | | 1280 | 1070 | | 2150 |
| 6B | 1110 | | 1860 | 1080 | | 2140 |
| 6C | | 1420 | | | 1540 | |
| 6D | 920 | | 1740 | 1070 | | 2120 |
| 6E | 1380 | | 2490 | 1080 | | 2140 |

TABLE 6C

| CMP Composition | TEOS: Tungsten Selectivity | | |
|---|---|---|---|
| | 1.0 psi | 1.5 psi | 2.0 psi |
| 6A | 1.6 | | 1.7 |
| 6B | 1.0 | | 1.2 |
| 6C | | 1.1 | |
| 6D | 1.2 | | 1.2 |
| 6E | 0.8 | | 0.9 |

As is apparent from the results set forth in Tables 6B and 6C, high TEOS removal rates can be achieved such that the TEOS:W selectivity may be in a range from about 2:1 to about 0.8:1. In this example the TEOS removal rates are generally greater than the tungsten removal rates.

Example 7

The tungsten, silicon oxide (TEOS), and silicon nitride (SiN) polishing rates were evaluated in this example for two polishing compositions. This example demonstrates the effect of phosphonic acid additions on the tungsten, TEOS, and SiN polishing rates. Polishing compositions 7A-7D included colloidal silica abrasive particles having a core shell structure in which a hydrolyzed or partially hydrolyzed aminopropyl trialkoxysilane was incorporated in the shell using a procedure similar to that described below in Example 11. A concentrated dispersion including the above described colloidal silica abrasive particles was then added to a mixture including malonic acid, ferric nitrate nonahydrate (Fe(NO$_3$)$_3$·9H$_2$O), and water. Each composition included 2.0 weight percent of the colloidal silica having a mean particle size of about 55 nm. Each composition further included 2.0 weight percent hydrogen peroxide, 20 ppm Fe(NO$_3$)$_3$·9H$_2$O, a fixed molar ratio of malonic acid to Fe(NO$_3$)$_3$·9H$_2$O of 8:1, and 500 ppm glycine, Dequest® 2010, at a pH of 3.0.

The polishing rates were obtained by polishing 300 mm (12 inch) diameter wafers having the appropriate layers using a Reflexion® CMP tool and a VP3100 polishing pad at a downforce of 1.5 psi, with a platen speed of 100 rpm and a slurry flow rate of 250 ml/min. Table 7 lists the quantity of 1-hydroxyethylidene-1,1,-diphosphonic acid (Dequest® 2010) in each composition as well as the TEOS, tungsten, and SiN polishing rates.

TABLE 7

| Polishing Composition | Dequest® 2010 (ppm) | TEOS Rate (Å/min) | Tungsten Rate (Å/min) | SiN Rate (Å/min) |
|---|---|---|---|---|
| 7A | 60 | 690 | 290 | 53 |
| 7B | 240 | 1010 | 280 | 310 |
| 7C | 420 | 950 | 250 | 570 |
| 7D | 600 | 870 | 260 | 640 |

As is apparent from the results set forth in Table 7, high TEOS and SiN rates can be achieved such that the TEOS:W selectivity is greater than 3:1 and the SiN:W selectivity is in a range from about 1:1 (7B) to about 2.5:1 (7D).

Example 8

The tungsten and silicon oxide (TEOS) polishing rate were evaluated in this example for two tungsten buff polishing compositions. A comparative polishing composition 8A included PL-3C available from Fuso Chemical Company (Tokyo Japan). PL-3C is a surface treated colloidal silica in which the colloidal silica surface is treated (bonded) with aminopropyl trialkoxysilane. The mean particle size was about 0.07 µm. Polishing composition 8B included colloidal silica abrasive particles having a core shell structure in which a hydrolyzed or partially hydrolyzed aminopropyl trialkoxysilane was incorporated in the shell using a procedure similar to that described below in Example 11. The mean particle size was about 0.06 µm. A concentrated dispersion including the above described colloidal silica abrasive particles was then added to a mixture including malonic acid, ferric nitrate nonahydrate, and water. Each of the polishing compositions (8A and 8B) included 10 ppm by weight Fe(NO$_3$)$_3$·9H$_2$O, 60 ppm by weight malonic acid, 500 ppm by weight glycine, 2.0 weight percent of the corresponding colloidal silica particles, and 2 weight percent hydrogen peroxide at a pH of 4.0.

The polishing rates were obtained by polishing 200 mm (8 inch) diameter wafers having the appropriate layers using a Mirra® CMP tool and an IC1010 polishing pad at a downforce of 1.5 psi. The platen and carrier speeds were 93 and 87 rpm respectively and the slurry flow rate was 150 ml/min. Table 8 lists the colloidal silica particle size, the zeta potential and the TEOS and tungsten polishing rates for both polishing compositions.

TABLE 8

| Polishing Composition | Particle Size (µm) | Zeta Potential (mV) | Tungsten Rate (Å/min) | TEOS Rate (Å/min) |
|---|---|---|---|---|
| 8A | 0.07 | 29 | 510 | 520 |
| 8B | 0.06 | 30 | 600 | 1130 |

As is apparent from the results set forth in Table 8, the inventive polishing composition 8B has a TEOS polishing rate of over 2 times that of the comparative polishing composition 8A. Moreover the tungsten polishing rate of the inventive composition was nearly 20 percent greater than the comparative composition.

Example 9

The shelf-life stability of two concentrated polishing compositions was evaluated in this example. A comparative polishing composition 8A included PL-3C available from Fuso Chemical Company (Tokyo Japan). PL-3C is a surface treated colloidal silica in which the colloidal silica surface is treated (bonded) with aminopropyl trialkoxysilane. The mean particle size was about 0.07 µm. Polishing composition 8B included colloidal silica abrasive particles having a core shell structure in which a hydrolyzed or partially hydrolyzed aminopropyl trialkoxysilane was incorporated in the shell using a procedure similar to that described below in Example 11. The mean particle size was about 0.06 µm. A concentrated dispersion including the above described colloidal silica abrasive particles was then added to a mixture including malonic acid, ferric nitrate nonahydrate, and water. Each of the polishing compositions (8A and 8B) included 4.0 weight percent of the respective colloidal silica, 20 ppm by weight $Fe(NO_3)_3 \cdot 9H_2O$, 100 ppm by weight malonic acid, and 0.1 weight percent glycine at a pH of 4.0. Table 9 shows shelf-life stability data for the two compositions.

TABLE 9

| Polishing Composition | Initial Particle Size (µm) | Three Day Particle Size (µm) |
|---|---|---|
| 9A | 0.07 | 0.5 |
| 9B | 0.06 | 0.06 |

As is apparent from the results set forth in Table 9, the inventive concentrated polishing composition 9B is significantly more stable than comparative concentrated polishing composition 9A. After three days the comparative composition has been observed to form large aggregated particles (about 0.5 µm) that settle out of colloidal suspension. The inventive composition was stable with no observed settling and no observed change in mean particle size with time.

Example 10

The patterned silicon oxide (TEOS) polishing rates as well oxide erosion were evaluated in this example for two polishing compositions. The polishing compositions were identical to those evaluated in Example 8. Thus polishing composition 10A was identical to polishing composition 8A and polishing composition 10B was identical to polishing composition 8B.

The polishing data were obtained by polishing 200 mm (8 inch) diameter patterned wafers using a Mirra® CMP tool and an IC1010 polishing pad at a downforce of 1.5 psi. The platen and carrier speeds were 93 and 87 rpm respectively and the slurry flow rate was 150 ml/min. The TEOS oxide pattern polishing rate, the oxide erosion and the step height were measured on a pattern having a 0.18 µm line width and a 50% pattern density. Results are shown in Table 10.

TABLE 10

| Polishing Composition | TEOS Pattern Rate (Å/min) | Erosion (Å) | Step Height (Å) |
|---|---|---|---|
| 10A | 270 | 580 | 650 |
| 10B | 1150 | 380 | 290 |

As is apparent from the results set forth in Table 10, the inventive polishing composition 10B has superior patterned wafer performance as compared to the comparative polishing composition 10A. For example, inventive polishing composition 10A has a TEOS pattern rate greater than 4 times that of the comparative composition 10B as well as a significantly reduced oxide erosion (35 percent reduction) and step height (55 percent reduction).

Example 11

A chemical-mechanical polishing composition was prepared as follows. A 2,604 gram quantity of BS-1H colloidal silica dispersion (a 10.5 wt. % colloidal silica dispersion having a mean particle size of about 35 nm available from Fuso Chemical Company, Tokyo, Japan) was added to 5,882 grams of DI water. 3-ethoxypropylamine (EOPA) was added to the mixture to adjust the pH to 10 and thereby yield a mother liquid. The mother liquid was then heated to 80 degrees C. A mixture of 1872.3 grams of tetramethoxysilane and 16.3 grams of 3-aminopropyltrimethoxysilane was added to the mother liquid at a constant rate for a duration of 180 minutes (at a rate of about 10.5 grams per minute) while maintaining the liquid temperature at 80 degrees C. A colloidal silica dispersion including colloidal silica particles having an outer silica shell containing the aminosilane (or a hydrolyzed or partially hydrolyzed aminosilane) was obtained. This colloidal silica dispersion was concentrated to 4,600 milliliters by heating distillation at ordinary pressure. A volume of 3,000 milliliters of DI water was added to the dispersion to replace the methanol (and maintain the volume) during distillation. The final dispersion has a colloidal silica concentration of approximately 20.1 weight percent.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing composition comprising:
    a water based liquid carrier;
    colloidal silica abrasive particles dispersed in the liquid carrier;
    an aminosilane compound or a phosphonium silane compound incorporated in the colloidal silica abrasive particles internal to an outer surface thereof;
    an iron containing accelerator; and
    a pH in a range from about 1.5 to about 7.

2. The composition of claim 1, wherein the colloidal silica abrasive particles have a permanent positive charge of at least 10 mV.

3. The composition of claim 1, wherein the colloidal silica abrasive particles have a permanent positive charge of at least 15 mV.

4. The composition of claim 1, wherein the colloidal silica abrasive particles have a mean particle size in a range from about 30 to about 70 nm.

5. The composition of claim 1, comprising from about 0.2 to about 2 weight percent of the colloidal silica abrasive particles.

6. The composition of claim 1, comprising from about 1 to about 4 weight percent of the colloidal silica abrasive particles.

7. The composition of claim 1, wherein 30 percent or more of the colloidal silica abrasive particles include three or more aggregated primary particles.

8. The composition of claim 1, wherein 50 percent or more of the colloidal silica abrasive particles include three or more aggregated primary particles and 20 percent or more of the colloidal silica abrasive particles are monomers or dimers.

9. The composition of claim 1, wherein the aminosilane compound comprises a propyl group, primary amine, or quaternary amine.

10. The composition of claim 1, wherein the aminosilane compound comprises bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium, N-(trialkoxysilylethyl)benzyl-N,N,N-trimethyl ammonium, (bis(methyldialkoxysilylpropyl)-N-methyl amine, bis(trialkoxysilylpropyl)urea, bis(3-(trialkoxysilyl) propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, (N-trialkoxysilylpropyl)polyethyleneimine, trialkoxysilylpropyldiethylenetriamine, N-phenyl-3-aminopropyltrialkoxysilane, N-(vinylbenzyl)-2-aminoethyl-3-aminopropyltrialkoxysilane, 4-aminobutyltrialkoxysilane, or a mixture thereof.

11. The composition of claim 1, having a pH in a range from about 2.0 to about 4.5.

12. The composition of claim 1, wherein the iron containing accelerator comprises a soluble iron containing catalyst.

13. The composition of claim 12, further comprising a stabilizer bound to the soluble iron containing catalyst, the stabilizer being selected from the group consisting of phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

14. The composition of claim 12, further comprising a hydrogen peroxide oxidizer.

15. The composition of claim 1, having an electrical conductivity of less than 1000 µS/cm.

16. The composition of claim 1, further comprising an amine compound in solution in the liquid carrier.

17. The composition of claim 16, wherein the amine compound comprises an alkyl group having 12 or more carbon atoms; a polyquaternary amine compound; or an amine containing polymer having four or more amine groups.

18. The composition of claim 1, wherein the colloidal silica abrasive particles have a core-shell structure in which an outer shell is disposed over an inner core, the aminosilane compound being incorporated in the outer shell.

19. The composition of claim 1, wherein the colloidal silica abrasive particles have a density of greater than 1.90 g/cm$^3$.

20. The composition of claim 1, wherein a molar ratio of the aminosilane compound to silica in the colloidal silica abrasive particles is less than 10 percent.

21. The composition of claim 1, wherein:
    the colloidal silica abrasive particles have a permanent positive charge of at least 10 mV;
    the iron containing accelerator comprises a soluble iron containing catalyst;
    the composition further comprises a stabilizer bound to the soluble iron containing catalyst;
    the composition further comprises an amine compound in solution in the liquid carrier;
    30 percent or more of the colloidal silica abrasive particles include three or more aggregated primary particles; and
    the composition has a pH in a range from about 2 to about 3.5.

22. The composition of claim 21, further comprising from about 0.2 to about 2 weight percent of the colloidal silica abrasive particles.

23. The composition of claim 1, wherein:
    the colloidal silica abrasive particles have a permanent positive charge of at least 10 mV;
    the iron containing accelerator comprises a soluble iron containing catalyst;
    the composition further comprises a stabilizer bound to the soluble iron containing catalyst;

the composition further comprises an amine compound in solution in the liquid carrier;

30 percent or more of the colloidal silica abrasive particles include three or more aggregated primary particles; and the composition has a pH in a range from about 3 to about 4.5 and an electrical conductivity of less than about 1000 μS/cm.

24. The composition of claim 23, further comprising from about 1 to about 4 weight percent of the colloidal silica abrasive particles.

25. A chemical-mechanical polishing composition comprising:
a water based liquid carrier;
colloidal silica abrasive particles dispersed in the liquid carrier;
a chemical species incorporated in the colloidal silica abrasive particles internal to an outer surface thereof, wherein the chemical species is a nitrogen-containing compound or a phosphorus-containing compound, wherein the colloidal silica abrasive particles have a permanent positive charge of at least 15 mV;
an iron containing accelerator; and
a pH in a range from about 2 to about 4.5;
wherein the chemical species is not an aminosilane.

26. The composition of claim 25, wherein 30 percent or more of the colloidal silica abrasive particles include three or more aggregated primary particles.

27. The composition of claim 25, wherein 50 percent or more of the colloidal silica abrasive particles include three or more aggregated primary particles and 20 percent or more of the colloidal silica abrasive particles are monomers or dimers.

28. The composition of claim 25, wherein the aminosilane compound comprises a propyl group, primary amine, or quaternary amine.

29. The composition of claim 25, wherein the iron containing accelerator comprises a soluble iron containing catalyst.

30. The composition of claim 29, further comprising a stabilizer bound to the soluble iron containing catalyst, the stabilizer being selected from the group consisting of phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

31. The composition of claim 29, further comprising a hydrogen peroxide oxidizer.

32. The composition of claim 25, further comprising an amine compound in solution in the liquid carrier.

33. The composition of claim 25, wherein the colloidal silica abrasive particles have a core-shell structure in which an outer shell is disposed over an inner core, the chemical species being incorporated in the outer shell.

34. The composition of claim 25, wherein a molar ratio of the chemical species to silica in the colloidal silica abrasive particles is less than 10 percent.

35. The composition of claim 25, wherein:
the colloidal silica abrasive particles have a permanent positive charge of at least 10 mV;
the iron containing accelerator comprises a soluble iron containing catalyst;
the composition further comprises a stabilizer bound to the soluble iron containing catalyst;
the composition further comprises an amine compound in solution in the liquid carrier;

30 percent or more of the colloidal silica abrasive particles include three or more aggregated primary particles;

The composition comprising from about 0.2 to about 2 weight percent of the colloidal silica abrasive particles; and the composition has a pH in a range from about 2 to about 3.5.

36. The composition of claim 25, wherein:
the colloidal silica abrasive particles have a permanent positive charge of at least 10 mV;
the iron containing accelerator comprises a soluble iron containing catalyst;
the composition further comprises a stabilizer bound to the soluble iron containing catalyst;
the composition further comprises an amine compound in solution in the liquid carrier;
30 percent or more of the colloidal silica abrasive particles include three or more aggregated primary particles;
the composition comprising from about 1 to about 4 weight percent of the colloidal silica abrasive particles; and
the composition has a pH in a range from about 3 to about 4.5 and an electrical conductivity of less than about 1000 μS/cm.

37. A method for chemical-mechanical polishing a substrate including a tungsten layer, the method comprising:
(a) contacting the substrate with the chemical mechanical polishing composition of claim 1;
(b) moving the polishing composition relative to the substrate; and
(c) abrading the substrate to remove a portion of the tungsten layer from the substrate and thereby polish the substrate.

38. The method of claim 37, wherein:
the substrate further comprises a silicon oxygen material; and
a rate of removal of the silicon oxygen material in (c) is greater than or equal to a rate of removal of tungsten in (c).

39. The method of claim 38, wherein:
the substrate further comprises a silicon nitrogen material; and
a rate of removal of the silicon nitrogen material in (c) is greater than or equal to a rate of removal of tungsten in (c).

40. The method of claim 37, wherein:
the substrate further comprises a silicon oxygen material; and
a rate of removal of tungsten in (c) is at least 40 times greater than a removal rate of the silicon oxygen material in (c).

41. A method for manufacturing a chemical-mechanical polishing composition, the method comprising:
(a) providing a liquid solution;
(b) combining the liquid solution, a silica producing compound, and an aminosilane compound thereby causing colloidal silica particles to grow such that a dispersion is obtained including colloidal silica particles having the aminosilane compound incorporated therein;
(c) admixing an iron containing accelerator to the dispersion; and
(d) adjusting the pH of the dispersion to value in a range from about 2 to about 4.5.

* * * * *